US010818787B1

(12) United States Patent
Banerjee et al.

(10) Patent No.: US 10,818,787 B1
(45) Date of Patent: Oct. 27, 2020

(54) ELECTRONIC DEVICE INCLUDING A HIGH ELECTRON MOBILITY TRANSISTOR INCLUDING A GATE ELECTRODE AND A DIELECTRIC FILM

(71) Applicant: Semiconductor Components Industries, LLC, Phoenix, AZ (US)

(72) Inventors: Abhishek Banerjee, Kruibeke (BE); Peter Moens, Erwetegem (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/515,269

(22) Filed: Jul. 18, 2019

Related U.S. Application Data

(60) Provisional application No. 62/835,592, filed on Apr. 18, 2019.

(51) Int. Cl.

| | |
|---|---|
| *H01L 29/778* | (2006.01) |
| *H01L 29/51* | (2006.01) |
| *H01L 29/20* | (2006.01) |
| *H01L 29/40* | (2006.01) |
| *H01L 29/417* | (2006.01) |
| *H01L 29/423* | (2006.01) |

(52) U.S. Cl.
CPC ...... *H01L 29/7786* (2013.01); *H01L 29/2003* (2013.01); *H01L 29/402* (2013.01); *H01L 29/41725* (2013.01); *H01L 29/42316* (2013.01); *H01L 29/512* (2013.01)

(58) Field of Classification Search
CPC ............. H01L 29/7786; H01L 29/2003; H01L 29/402; H01L 29/512; H01L 29/42316; H01L 29/41725
See application file for complete search history.

(56) References Cited

U.S. PATENT DOCUMENTS

| | | | |
|---|---|---|---|
| 10,741,496 B2* | 8/2020 | Huang | ............... H01L 29/42316 |
| 2009/0146185 A1* | 6/2009 | Suh | ....................... H01L 29/7781 |
| | | | 257/194 |
| 2010/0258843 A1 | 10/2010 | Lidow et al. | |
| 2013/0313560 A1 | 11/2013 | Khalil et al. | |
| 2014/0070280 A1* | 3/2014 | Briere | ................. H01L 29/7786 |
| | | | 257/194 |
| 2015/0028390 A1 | 1/2015 | Colino et al. | |
| 2015/0144953 A1* | 5/2015 | Hill | ....................... H01L 29/402 |
| | | | 257/76 |

(Continued)

*Primary Examiner* — Victor A Mandala
(74) *Attorney, Agent, or Firm* — Abel Schillinger, LLP

(57) ABSTRACT

An electronic device can include a HEMT. In an embodiment, a gate electrode, a drain electrode, and an access region including a first portion closer to the gate electrode and a second portion closer to the drain electrode. A lower dielectric film can overlie a portion of the access region, and an upper dielectric region can overlie another portion of the access region. In another embodiment, a dielectric film can have a relatively positive or negative charge and a varying thickness. In a further embodiment, the HEMT can include a gate electrode; a dielectric film overlying the gate electrode and defining openings to the gate electrode, wherein a portion of the dielectric film is disposed between the openings; and a gate interconnect extending into the openings of the dielectric film and contacting the gate electrode and the portion of the dielectric film.

20 Claims, 10 Drawing Sheets

(56) References Cited

U.S. PATENT DOCUMENTS

| | | | |
|---|---|---|---|
| 2015/0270355 A1* | 9/2015 | Kuraguchi | H01L 29/0619 257/194 |
| 2015/0349117 A1* | 12/2015 | Chu | H01L 29/66462 257/66 |
| 2016/0035847 A1 | 2/2016 | Cao et al. | |
| 2016/0149007 A1* | 5/2016 | Chou | H01L 29/402 257/339 |
| 2017/0047437 A1* | 2/2017 | Nakayama | H01L 29/808 |
| 2017/0352754 A1 | 12/2017 | Beach et al. | |
| 2020/0006521 A1* | 1/2020 | Banerjee | H01L 29/0843 |
| 2020/0044067 A1* | 2/2020 | Banerjee | H01L 21/02271 |
| 2020/0083361 A1* | 3/2020 | Moens | H01L 29/66462 |
| 2020/0105916 A1* | 4/2020 | Moens | H01L 29/41775 |

\* cited by examiner

ELECTRONIC DEVICE INCLUDING A HIGH ELECTRON MOBILITY TRANSISTOR INCLUDING A GATE ELECTRODE AND A DIELECTRIC FILM

CROSS REFERENCE TO RELATED APPLICATION

This application claims priority under 35 U.S.C. § 119(e) to U.S. Patent Application No. 62/835,592 entitled "Electronic Device Including a High Electron Mobility Transistor Including a Gate Electrode and a Dielectric Film," by Banerjee et al., filed Apr. 18, 2019, which is assigned to the current assignee hereof and incorporated herein by reference in its entirety.

FIELD OF THE DISCLOSURE

The present disclosure relates to electronic devices, and more particularly to, electronic devices including high electron mobility transistors including gate electrodes and dielectric films.

RELATED ART

Enhancement-mode high electron mobility transistors can have a gate field electrode extending toward the drain electrode to help with device reliability. However, the gate field electrode can increase the gate-to-drain capacitance, $C_{GD}$, that results in a higher Miller ratio, which is $C_{GD}/C_{GS}$, where CGS is the gate-to-source capacitance. Other parameters that affect performance of the device include subthreshold slope and on-state resistance, $R_{DSON}$. For subthreshold slope, drain current, $I_D$, versus gate voltage, $V_{GS}$, can be plotted as the transistor is turned on. The subthreshold slope can be determined for a particular $I_D$ or range of $I_D$s as the device is turned off. Ideally, the subthreshold slope is uniform as the device turns on, and $R_{DSON}$ is to be low. Improving one variable typically comes at the expense of one of the other parameters. For example, improving resistance to gate bounce may be accompanied by lower device reliability, increased uniformity in subthreshold slope may be accompanied by higher $R_{DSON}$, etc. Thus, skilled artisans seek improved performance with no or little adverse consequences with device parameters.

BRIEF DESCRIPTION OF THE DRAWINGS

Embodiments are illustrated by way of example and are not limited in the accompanying figures.

Figure 1:
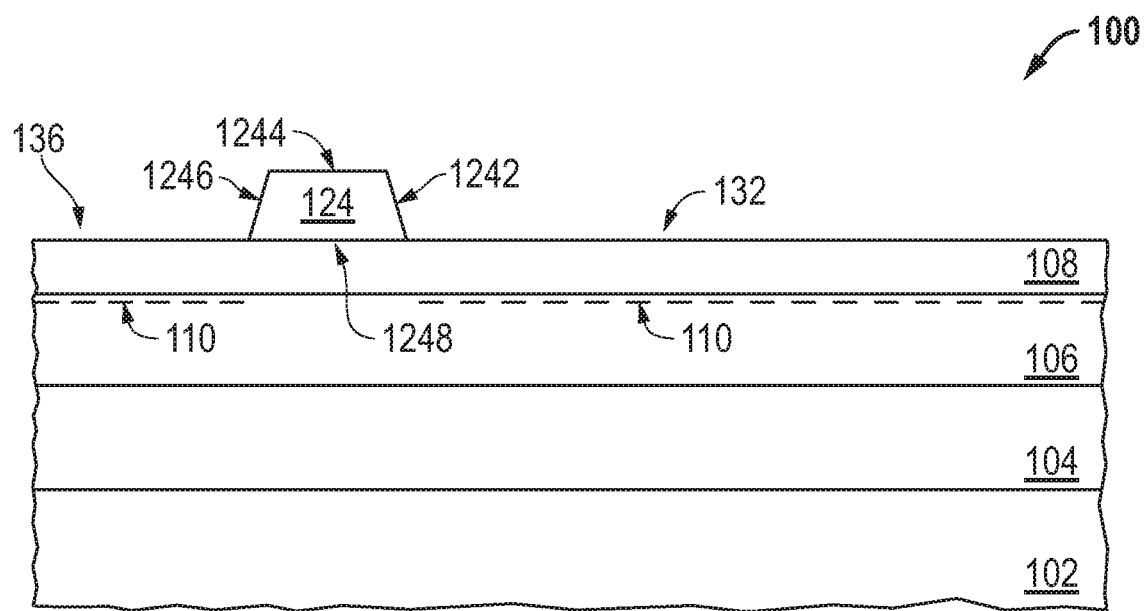
FIG. 1 includes an illustration including a cross-sectional view of a portion of a workpiece including a substrate, a buffer layer, a channel layer, a barrier layer, and a gate electrode.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

A III-V material is intended to mean a material that includes at least one Group 13 element and at least one Group 15 element. A III-N material is intended to mean a semiconductor material that includes at least one Group 13 element and nitrogen.

The term "negatively charged" and "positively charged" when referring to a film or layer are used with respect to an electron density of a two-dimension electron gas along a heterojunction between two layers, such as a channel layer and a barrier layer. Without a negatively or positively charged film or layer overlying the upper layer (e.g., the barrier layer) of the two layers, the two-dimension electron gas has a baseline electron density. When a negatively charged film or layer overlies the upper layer (e.g., the barrier layer), electrons are repelled from the heterojunction, thus reducing the electron density and increasing the sheet resistance of the two-dimension electron gas. When a positively charged film or layer overlies the upper layer (e.g., the barrier layer), electrons are attracted to the heterojunction, thus increasing the electron density and decreasing the sheet resistance of the two-dimension electron gas. The negatively and positively charged films or layers have the opposite effect with respect to a hole density of a two-dimension hole gas. The negatively charged film or layer increases the hole density of the two-dimension hole gas, and the positively charged film or layer decreases the hole density of the two-dimension hole gas.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) for the value are reasonable differences from the ideal goal of exactly as described.

Group numbers correspond to columns within the Periodic Table of Elements based on the IUPAC Periodic Table of Elements, version dated Nov. 28, 2016.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

Features of a high electron mobility transistor (HEMT) can be used and improve performance of the HEMT. An extension region of a lower dielectric film can locally increase a sheet resistance of a two dimensional electron gas (2DEG) near a gate electrode and allow for faster depletion of charge. The locally higher sheet resistance can be designed so $R_{DSON}$ for the HEMT may not increase by more than 1 ohm·mm. An upper dielectric film can help reduce sheet resistance of the 2DEG to help counter some of the increased sheet resistance corresponding to the lower dielectric film. Cm can be lower and provide a lower Miller ratio. Output capacitance ($C_{OSS}$) for the HEMT is lower. Thus, the HEMT has improved switching characteristics. The lower dielectric film can cover corners of portions of a top surface of the gate electrode and help with more uniform subthreshold slope during turn on and increase the gate breakdown voltage.

Other features may also provide other advantages or alternatives to the design of the HEMT. The contact area between the gate electrode and gate interconnect can be reduced to reduce the gate current when the HEMT is on. A recession within the barrier layer near the gate electrode can be used to help increase the threshold voltage of the HEMT. The recession may or may not include the extension region of the lower dielectric film. The lower dielectric film can include a source-side extension region over a source-side access region of a barrier layer. The source-side extension region can help to increase the threshold voltage of the HEMT. A gate electrode can include a body region and an extension region that can help increase the threshold voltage of the HEMT.

In an aspect, an electronic device can include a high electron mobility transistor including a gate electrode, a drain electrode, and an access region including a first portion closer to the gate electrode and a second portion closer to the drain electrode. The electronic device can further include a first dielectric film and a second dielectric film, wherein the first dielectric film includes a first material and overlies the first portion and not the second portion of the access region, and the second dielectric film including a second material and overlies the second portion of the access region, wherein the second material is different from the first material.

In another aspect, an electronic device can include a high electron mobility transistor including a gate electrode having a top surface and a sidewall, a drain electrode, and an access region including a first portion closer to the gate electrode and a second portion closer to the drain electrode. The electronic device can further include a dielectric film contacting the top surface and sidewall of the gate electrode and overlying the access region. The dielectric film can include a first material with a negative charge and the dielectric film is relatively thicker over the first portion of the access region and relatively thinner over the second portion of the access region, or the dielectric film can include a second material with a positive charge and the dielectric film is relatively thinner over the first portion of the access region and relatively thicker over the second portion of the access region.

In a further aspect, an electronic device can include a high electron mobility transistor including a gate electrode; a dielectric film overlying the gate electrode and defining openings to the gate electrode, wherein a portion of the dielectric film is disposed between the openings; and a gate interconnect extending into the openings of the dielectric film and contacting the gate electrode and the portion of the dielectric film.

FIG. 1 includes a cross-sectional view of a portion of a workpiece 100 where a HEMT is being formed. The workpiece 100 can include a substrate 102, a buffer layer 104, a channel layer 106, a barrier layer 108, and a gate electrode 124. The substrate 102 can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The selection of the particular material and crystal orientation along the primary surface can be selected depending upon the composition of the overlying semiconductor layers.

The buffer layer 104 can include a III-N material, and in a particular embodiment, includes $Al_aGa_{(1-a)}N$, where $0 \leq a \leq 1$. The composition of the buffer layer 104 may depend on the composition of the channel layer 106 and the designed operating voltage of the HEMT. The composition of the buffer layer 104 can be changed as a function of thickness, such that the buffer layer 104 has a relatively greater aluminum content closer to the substrate 102 and relatively greater gallium content closer to the channel layer 106. In a particular embodiment, the cation (metal atoms) content in the buffer layer 104 near the substrate 102 can be 10 atomic % to 100 atomic % Al with the remainder Ga, and the cation content in the buffer layer 104 near the channel layer 106 can be 0 atomic % to 50 atomic % Al with the remainder Ga. In another embodiment, the buffer layer 104 can include a plurality of films. The buffer layer 104 can have a thickness in a range of approximately 1 micron to 5 microns.

The channel layer 106 can include $Al_xGa_{(1-x)}N$, where $0 \le x \le 0.1$ and have a thickness in a range of approximately 20 nm to 4000 nm. In a particular embodiment, the channel layer 106 is a GaN layer (x=0). The channel layer 106 may be unintentionally doped or doped with an electron donor (n-type) dopant or an electron acceptor (p-type) dopant. A 2DEG 110 can be formed near the interface of the channel layer 106 and the barrier layer 108 and is responsible for high mobility and lower resistivity of the transistor structure when in the on-state. Any reduction of the 2DEG electrons will increase $R_{DSON}$ of the HEMT. In an embodiment, the concentration of acceptors (when the carriers are electrons) or donors (when the carriers are holes) may be kept as low as reasonably possible.

In a particular embodiment, acceptors can include carbon from a source gas (e.g., $Ga(CH_3)_3$) when metalorganic chemical vapor deposition (MOCVD) is used to form the channel layer 106. In a particular embodiment, the lowest trap concentration is desired but may be limited by growth or deposition conditions and purity of the precursors. Thus, some carbon can become incorporated as the channel layer 106 is grown, and such carbon can result in unintentional doping. The carbon content may be controlled by controlling the deposition conditions, such as the deposition temperature and flow rates. In an embodiment, the channel layer 106 has a carrier impurity concentration that is greater than 0 and less than $1 \times 10^{14}$ atoms/cm$^3$ or less than $1 \times 10^{15}$ atoms/cm$^3$ and in another embodiment, at most $1 \times 10^{16}$ atoms/cm$^3$. In a further embodiment, the carrier impurity concentration is in a range from $1 \times 10^{13}$ atoms/cm$^3$ to $1 \times 10^{16}$.

In an embodiment, the channel layer 106 has a thickness that is at least 50 nm. When the thickness is less than 50 nm, a 2DEG may be more difficult to generate, maintain, or both. In another embodiment, the channel layer 106 has a thickness that is at most 5000 nm. In a further embodiment, the thickness of the channel layer 106 may be at most 1000 nm and provide good dynamic $R_{DSON}$. In a particular embodiment, the thickness in a range of 50 nm to 1000 nm can provide sufficiently thick channel layer 106 to allow for the proper generation and maintaining of the 2DEG and still obtain a reasonable dynamic $R_{DSON}$. Although not illustrated, a spacer layer may be used between the channel and barrier layers 106 and 108 if desired.

The barrier layer 108 can include a III-V semiconductor material, such as a III-N semiconductor material. In an embodiment, the barrier layer 108 can include $Al_yIn_zGa_{(1-y-z)}N$, wherein $0 \le y \le 1.0$, $0 \le z \le 0.3$, and $0 < (y+z) \le 1$. The barrier layer 108 may have a lower Ga content as compared to the channel layer 106. In an embodiment, the barrier layer 108 may be undoped or unintentionally doped as previously described with respect to the channel layer 106. The barrier layer 108 can have any of the dopant concentrations as previously described with respect to channel layer 106. In an embodiment, the barrier layer 108 and the channel layer 106 can have substantially the same concentration or different dopant concentrations. In a further embodiment, at least a portion of the barrier layer 108 may be doped with a p-type dopant that may improve contact resistance; however, the lower contact resistance may come with an increase of the sheet resistance associated with the 2DEG 110 at the interface between the channel and barrier layers 106 and 108.

The barrier layer 108 can include a single film or a plurality of films. When the barrier layer 108 includes a plurality of films, the aluminum content can remain substantially the same or increase as distance from the channel layer 106 increases. As the aluminum content in the barrier layer 108 increases, the thickness of the barrier layer 108 may be relatively thinner. In an embodiment, the barrier layer 108 has a thickness of at least 10 nm, and in another embodiment, the barrier layer 108 has a thickness of at most 150 nm. In a particular embodiment, the barrier layer 108 has a thickness in a range from 20 nm to 90 nm.

The buffer layer 104, the channel layer 106, and barrier layer 108 are formed using an epitaxial growth technique, and thus, the barrier layer 108, the channel layer 106, and at least a portion of the buffer layer 104 can be monocrystalline. In a particular embodiment, metal-containing films can be formed using metalorganic chemical vapor deposition.

The gate electrode 124 can include a III-V semiconductor material. An example of such material can include a p-type semiconductor material. In an embodiment, the gate electrode 124 can include p-type doped $Al_cGa_{(1-c)}N$ wherein $0 \le c \le 1$. In a particular embodiment, the gate electrode 124 includes a p-type dopant, such as Mg, Zn, Cd, or the like. In another embodiment, the dopant concentration in the gate electrode 124 can have a dopant concentration of at least $1 \times 10^{18}$ atoms/cm$^3$. In another embodiment, the dopant concentration is at most $1 \times 10^{21}$ atoms/cm$^3$. The gate electrode 124 has a thickness in a range from 20 nm to 300 nm.

The gate electrode layer for the gate electrode 124 can be formed using any of the techniques that can be used in forming the channel layer 106 or the barrier layer 108. The p-type dopant can be incorporated in-situ or introduced into the film after deposition. The gate electrode layer can be patterned to form the gate electrode 124. The 2DEG 110 lies along the interface between the channel and barrier layers 106 and 108 except under the gate electrode 124. Thus, the transistor being formed is an enhancement-mode HEMT. The gate electrode 124 has a drain-side sidewall 1242, a source-side sidewall 1246, a top surface 1244, and a bottom surface 1248. The drain-side sidewall 1242 and the top surface 1244 meet at an upper drain-side corner, the drain-side sidewall 1242 and the bottom surface 1248 meet at a lower drain-side corner. The source-side sidewall 1246 and the top surface 1244 meet at an upper source-side corner, the source-side sidewall 1246 and the bottom surface 1248 meet at a lower source-side corner. The significance of the surfaces and corners are addressed later in this specification. Portions of the barrier layer 108 not covered by the gate electrode 124 are referred to herein as access regions and include a drain-side access region 132 and a source-side access region 136.

Figure 2:
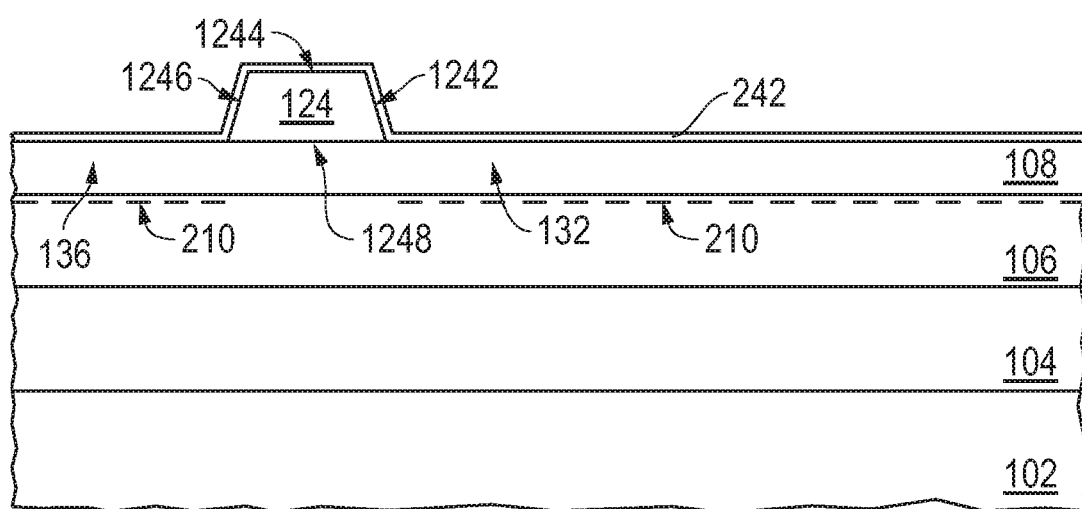
FIG. 2 includes an illustration including a cross-sectional view of the workpiece of FIG. 1 after forming a lower dielectric film.

A lower dielectric film 242 is formed over the gate electrode 124 and the barrier layer 108 as illustrated in FIG. 2. The lower dielectric film 242 can be a negatively charged film. The negative charge within the negatively charged film can occur by (1) fixed negative charges at an interface between the such film (e.g., the lower dielectric film 242) and the immediately adjacent film or layer (e.g., the barrier layer 108) closer to the 2DEG or (2) a negative charge within the bulk of the such film (e.g., the lower dielectric film 242). Thus, electrons are repelled from the interface between channel and barrier layers 106 and 108. A 2DEG 210 is similar in location to and has a higher sheet resistance (less conductive) as compared to the 2DEG 110. In an embodiment, the lower dielectric film 242 can include nitrogen-containing compound. When the material of the lower dielectric film 242 includes an oxynitride, the atomic content of N within the oxynitride can be greater than the atomic content of O within the oxynitride. The lower dielectric film 242 can include $Si_3N_4$, $SiO_kN_l$, where k<l, AlN, $AlO_rN_s$, where r<s, or another nitrogen-containing dielectric material suitable to produce a negatively charged film.

The thickness of the lower dielectric film 242 is sufficient to affect the sheet resistance of the 2DEG. The lower dielectric film 242 contacts the sidewalls 1242 and 1246 and the top surface 1244 of the gate electrode 124. In an embodiment, the thickness of the lower dielectric film 242 is at least 1 nm. The sheet resistance of the 2DEG increases with increasing thickness of the lower dielectric film 242 until the thickness is greater than 10 nm. A further increase in thickness can be used; however, such an increased thickness will not significantly increase the sheet resistance. In an embodiment, the thickness may be at most 50 nm, at most 25 nm, or at most 15 nm. The lower dielectric film 242 may be formed using plasma-enhanced atomic layer deposition (PEALD) or low-pressure chemical vapor deposition (LP-CVD). If needed or desired, the lower dielectric film 242 can be annealed at a temperature in a range from 400° C. to 800° C. for a time in a range from 2 minutes to 120 minutes. A variety of different gases may be used during the anneal. The annealing gas can include ammonia ($NH_3$), hydrogen ($H_2$) with or without an inert gas (such as a noble gas), oxygen (02), or the like.

Figure 3:
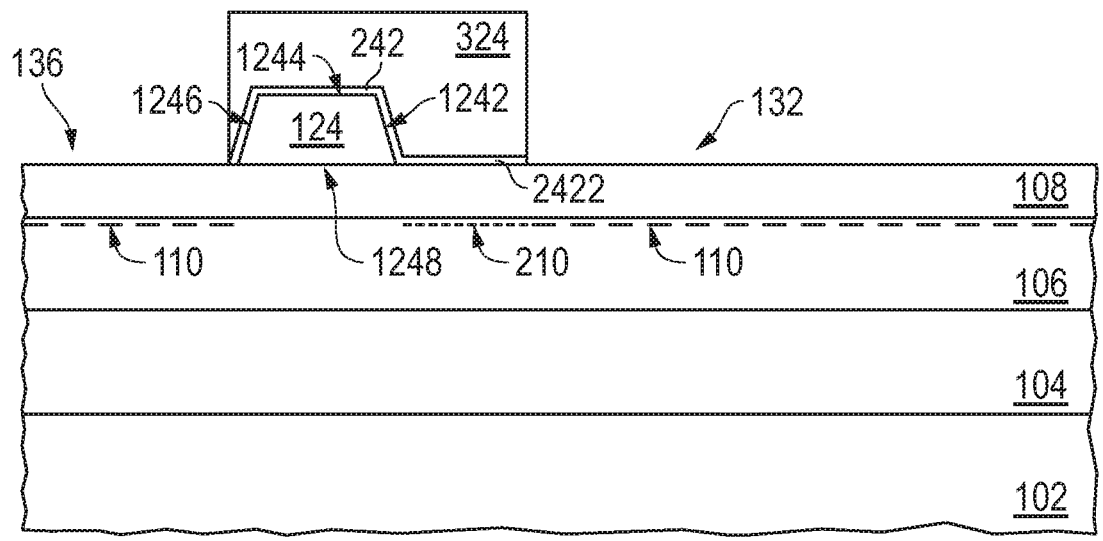
FIG. 3 includes an illustration including a cross-sectional view of the workpiece of FIG. 2 after forming a masking feature and patterning the lower dielectric film.

A masking feature 342 is formed over the lower dielectric film 242, and exposed portions of the lower dielectric film 242 are removed as illustrated in FIG. 3. The remaining portion of the lower dielectric film 242 covers the sidewalls 1242 and 1246 and top surface 1244 of the gate electrode 124 and includes a drain-side extension region 2422 that overlies the drain-side access region 132 of the barrier layer 108 and extends laterally toward a location where the drain electrode will be subsequently formed. When the drain-side sidewall 1242, top surface 1244, and upper drain-side corner of the gate electrode 124 are covered, the subthreshold slope of the HEMT can be improved (more uniform when the transistor turns on) as compared to the lower dielectric film 242 not being present at the top surface 1244 and the upper corners of the gate electrode 124. Further information regarding the drain-side extension 2422 is provided later in this specification regarding a subsequently-formed gate field electrode. In another embodiment illustrated and described later in this specification, the lower dielectric film 242 may have a source-side extension region that overlies the source-side access region 136 and extends laterally toward a location where the source electrode will be subsequently formed. The masking feature is removed after the lower-dielectric film 242 is patterned.

Figure 4:
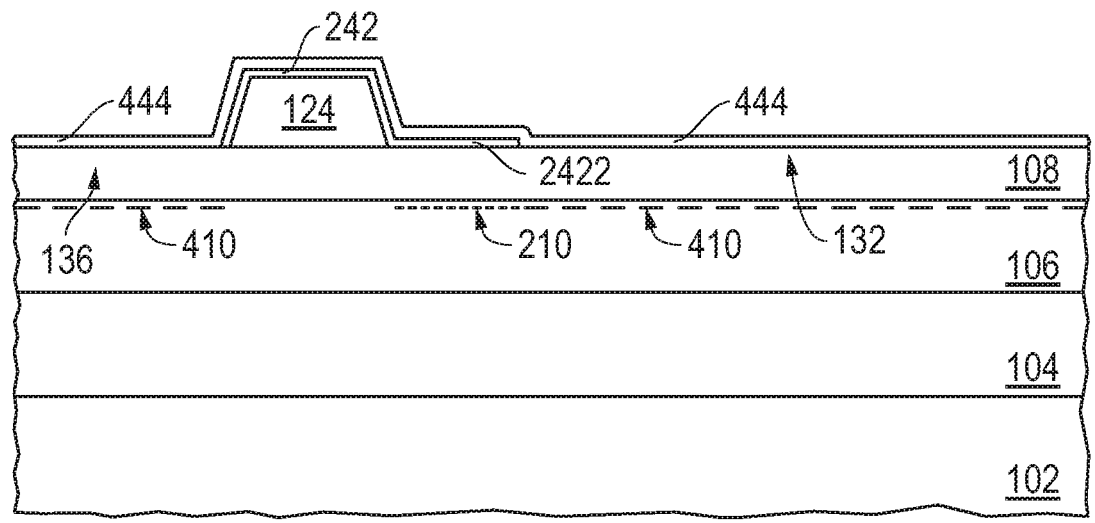
FIG. 4 includes an illustration including a cross-sectional view of the workpiece of FIG. 3 after removing the masking feature and forming an upper dielectric film.

An upper dielectric film 444 is formed over the lower dielectric film 242 and the barrier layer 108 as illustrated in FIG. 4. The upper dielectric film 444 can be a positively charged film. The positive charge within the positively charged film can occur by (1) fixed positive charges at an interface between the such film (e.g., the upper dielectric film 444) and the immediately adjacent film or layer (e.g., the barrier layer 108) closer to the 2DEG or (2) a positive charge within the bulk of the such film (e.g., the upper dielectric film 444). Thus, electrons can be attracted to the interface between channel and barrier layers 106 and 108. A 2DEG 410 has a lower sheet resistance (more conductive) as compared to the 2DEG 210. The 2DEG 410 may be substantially the same or a lower sheet resistance as compared to the 2DEG 110. In an embodiment, the upper dielectric film 444 can include oxygen-containing compound. When the material of the upper dielectric film 444 includes an oxynitride, the atomic content of O within the oxynitride can be greater than the atomic content of N within the oxynitride. The upper dielectric film 444 can include $Al_2O_3$, $AlO_tN_u$, where t>u, $SiO_2$, $HfO_2$, $SiO_mN_n$, where m>n, or another oxygen-containing dielectric material suitable to produce a positively charged film.

The thickness of the upper dielectric film 444 is sufficient to affect the sheet resistance of the 2DEG. In an embodiment, the thickness of the upper dielectric film 444 is at least 1 nm. The sheet resistance decreases with increasing thickness of the upper dielectric film 444 until the thickness is greater than 10 nm. A further increase in thickness can be used; however, such an increased thickness will not significantly decrease the sheet resistance. In an embodiment, the thickness may be at most 50 nm, at most 25 nm, or at most 15 nm. The upper dielectric film 444 may be formed using plasma-enhanced atomic layer deposition (PEALD) or depositing a thin film of a metal and thermally oxidizing the metal. Unlike the lower dielectric film 242, the upper dielectric film 444 covers all of the access regions 132 and 136 and is not patterned at this point in the process. If needed or desired, the upper dielectric film 444 can be annealed at a temperature in a range from 400° C. to 800° C. for a time in a range from 2 minutes to 120 minutes. A variety of different gases may be used during the anneal. The annealing gas can include ammonia ($NH_3$), hydrogen ($H_2$) with or without an inert gas (such as a noble gas), oxygen ($O_2$), or the like. In a particular embodiment, no anneal of the lower dielectric film 242 may be performed before forming the upper dielectric film 444, and both dielectric films 242 and 444 can be annealed during the same anneal.

Figure 5:
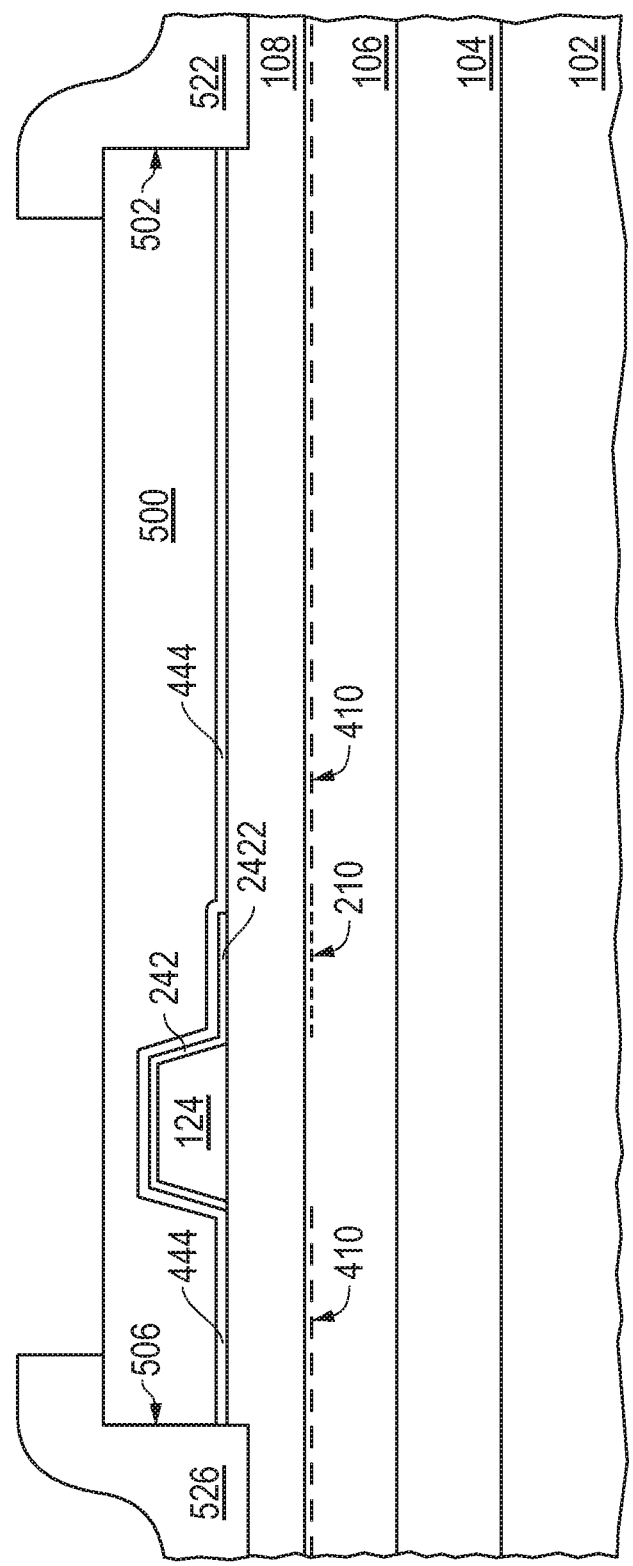
FIG. 5 includes an illustration including a cross-sectional view of the workpiece of FIG. 4 after forming an interlevel dielectric layer and drain and source electrodes.

FIG. 5 illustrates the workpiece after forming an interlevel dielectric (ILD) layer 500, a drain electrode 522, and a source electrode 526. The ILD layer 500 can be formed over the upper dielectric film 444. The ILD layer 500 can include an oxide, a nitride, or an oxynitride and include one film or more than one film. The ILD layer 500 can have a thickness in a range from 50 nm to 500 nm.

The ILD layer 500 can be patterned to define contact openings 502 and 506 for the drain and source electrodes 522 and 526. The contact openings 502 and 506 can extend through the ILD layer 500 and the dielectric films 242 and 444. In an embodiment, the contact openings 502 and 506 land on the barrier layer 108. In another embodiment, the contact openings 502 and 506 can extend through part of, but not all, of the thickness of the barrier layer 108 or extend through all of the thickness of the barrier layer 108 and contact the channel layer 106. In a particular embodiment, the contact openings 502 and 506 are formed such that portions of the barrier layer 108 are disposed between the channel layer 106 and the drain and source electrodes 522 and 526. The thickness of the barrier layer 108 under the drain and source electrodes 522 and 526 can be different from the thickness of the barrier layer 108 under the bottom surface 1248 of the gate electrode 124.

A conductive layer for the drain and source electrodes 522 and 526 is formed over the ILD layer 500 and within the contact openings 502 and 506. The conductive layer can include a single film or a plurality of films. In an embodiment, the conductive layer can include an adhesion film and a barrier film. Such films may include Ta, TaSi, Ti, TiW, TiSi, TiN, or the like. The conductive layer can further include a conductive bulk film. The bulk film can include Al, Cu, or another material that is more conductive than other films within the conductive layer. In an embodiment, the bulk film can include at least 90 wt % Al or Cu. The bulk film can have a thickness that is at least as thick as the other films within the conductive layer. In an embodiment, the bulk film has a thickness in a range from 20 nm to 900 nm and, in a more particular embodiment, in a range from 50 nm to 500 nm. More or fewer films can be used in the conductive layer. The number and composition of the films within the conductive layer can depend on the needs or desires for a particular application. After reading this specification, skilled artisans will be able to determine the composition of the conductive layer that is tailored to their devices. The conductive layer is patterned to form the drain electrode 522 and the source electrode 526.

Figure 6:
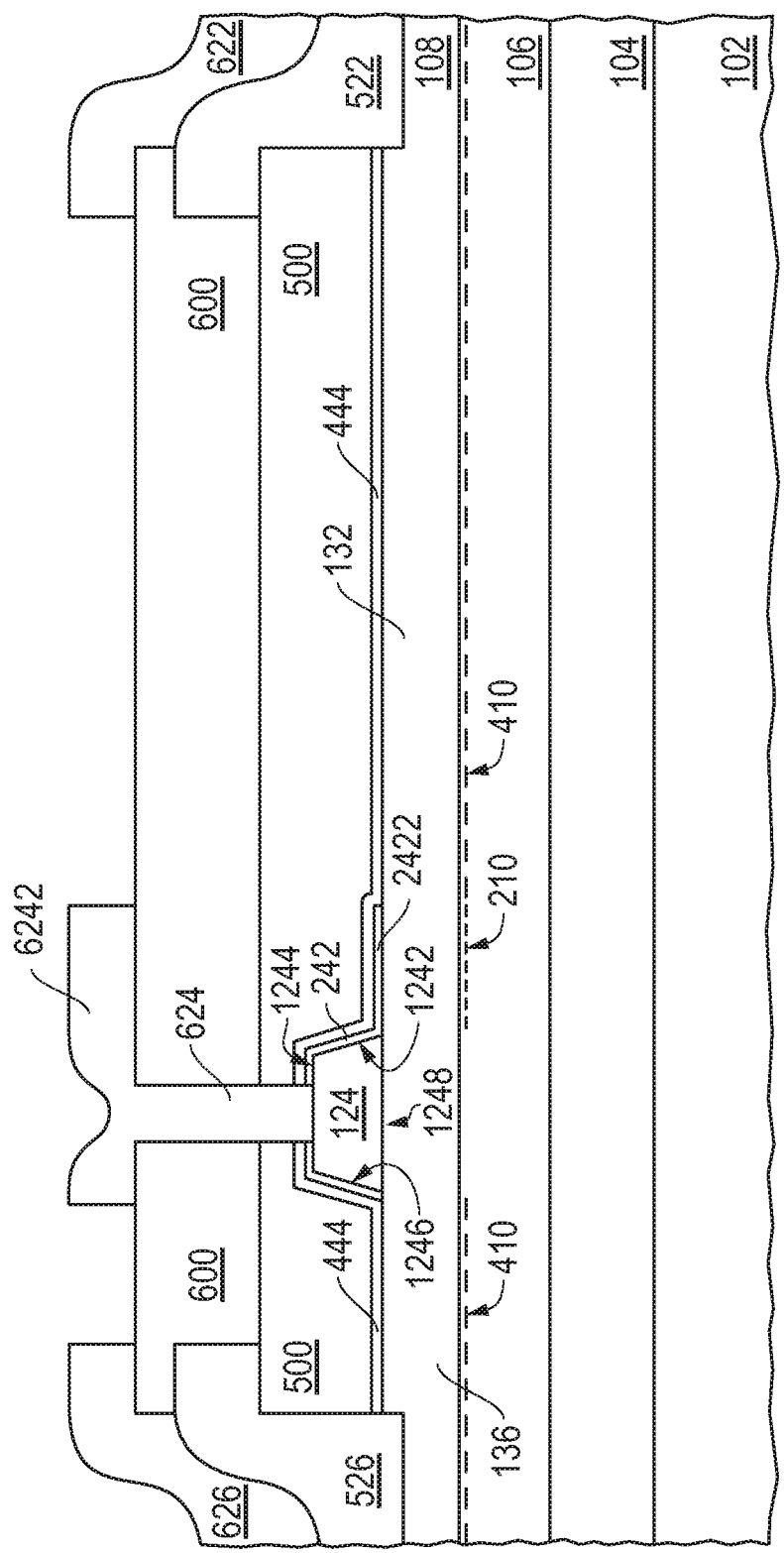
FIG. 6 includes an illustration including a cross-sectional view of the workpiece of FIG. 5 after forming another interlevel dielectric layer, conductive members, and a gate interconnect.

FIG. 6 illustrates the workpiece after forming another ILD layer 600, conductive members 622 and 626, and a gate interconnect 624. The insulating layer 600 can have any of the compositions, number of films, and thicknesses as previously described with respect to the ILD layer 500. The ILD 600 can have the same composition or different compositions, the same or different number of films, and the same thickness or different thicknesses as compared to the ILD layer 500.

The ILD layer 600 can be patterned to define openings for the conductive members 622 and 626 and the gate interconnect 624. The contact openings for the conductive members 622 and the 626 extend through the ILD layer 600 to the drain and source electrodes 522 and 526. The contact opening for the gate interconnect 624 can extend through the ILD layers 500 and 600 and the dielectric films 242 and 444. As can be seen in FIG. 6, the contact opening for the gate interconnect 624 is laterally offset so that the dielectric films 242 and 444 cover the upper drain-side and upper source-side corners and portions of the top surface 1244 of the gate electrode 124. As compared to a self-aligned gate process, where the upper corners are not covered by a dielectric film having a relatively negative charge, embodiments described herein have a better subthreshold slope because the lower dielectric film 242 helps to counter the holes (positive charge carriers) in the gate electrode 124.

A conductive layer for the conductive members 622 and 626 and the gate interconnect 624 is formed over the ILD layer 600 and within the contact openings. The conductive layer for the conductive members 622 and 626 and the gate interconnect 624 can have any of the compositions, number of films, and thicknesses as previously described with respect to the conductive layer for the drain and source electrodes 522 and 526. The conductive layer for the conductive members 622 and 626 and the gate interconnect 624 can have the same composition or different compositions, the same or different number of films, and the same thickness or different thicknesses as compared to the conductive layer for the drain and source electrodes 522 and 526. The conductive layer is patterned to form the conductive members 622 and 626 and the gate interconnect 624.

In this embodiment, the gate interconnect 624 includes a gate field electrode 6242. Each of the drain-side extension 2422 of the lower dielectric film 242 and the gate field electrode 6242 extend laterally over the drain-side access region 132. As used herein, laterally or a lateral direction is substantially parallel to the interface between the channel and barrier layers 106 and 108. In an embodiment, each the drain-side extension region 2422 and the gate field electrode 6242 extends laterally at most 8 microns, at most 6 microns, or at most 4 microns over the drain-side access region 132. When expressed as a fraction, each the drain-side extension region 2422 and the gate field electrode can extend laterally at most 0.5 times, at most 0.4 times, or at most 0.3 times the distance of the drain-side access region 132 between the gate electrode 124 and the drain electrode 522. In an embodiment, the distances that the drain-side extension region 2422 and the gate field electrode 6242 extend laterally over the drain-side access region 132 can be substantially the same. In an embodiment, the distance that the gate field electrode 6242 extends laterally over the drain-side access region 132 can be in a range of 0.5 times to 2.0 times the distance that the drain-side extension 2422 of the lower dielectric film 242 extends laterally over the drain-side access region 132. In a particular embodiment, the distances that the drain-side extension region 2422 and the gate field electrode 6242 extend laterally over the drain-side access region 132 are substantially the same.

In another embodiment, the gate field electrode 6242 may be separate from the gate interconnect 624. For example, an intervening conductive member may provide the gate interconnect, and another conductive member can include the gate field electrode 6242. In a further embodiment, an intervening conductive member may lie between the gate electrode 124 and another conductive member that includes the gate interconnect and gate field electrode. The gate field electrode 6242 is not required in all embodiments. The gate field electrode 6242 is an optional feature that can help with affecting the electrical field near the gate electrode 124 along the drain side of transistor.

Figure 7:
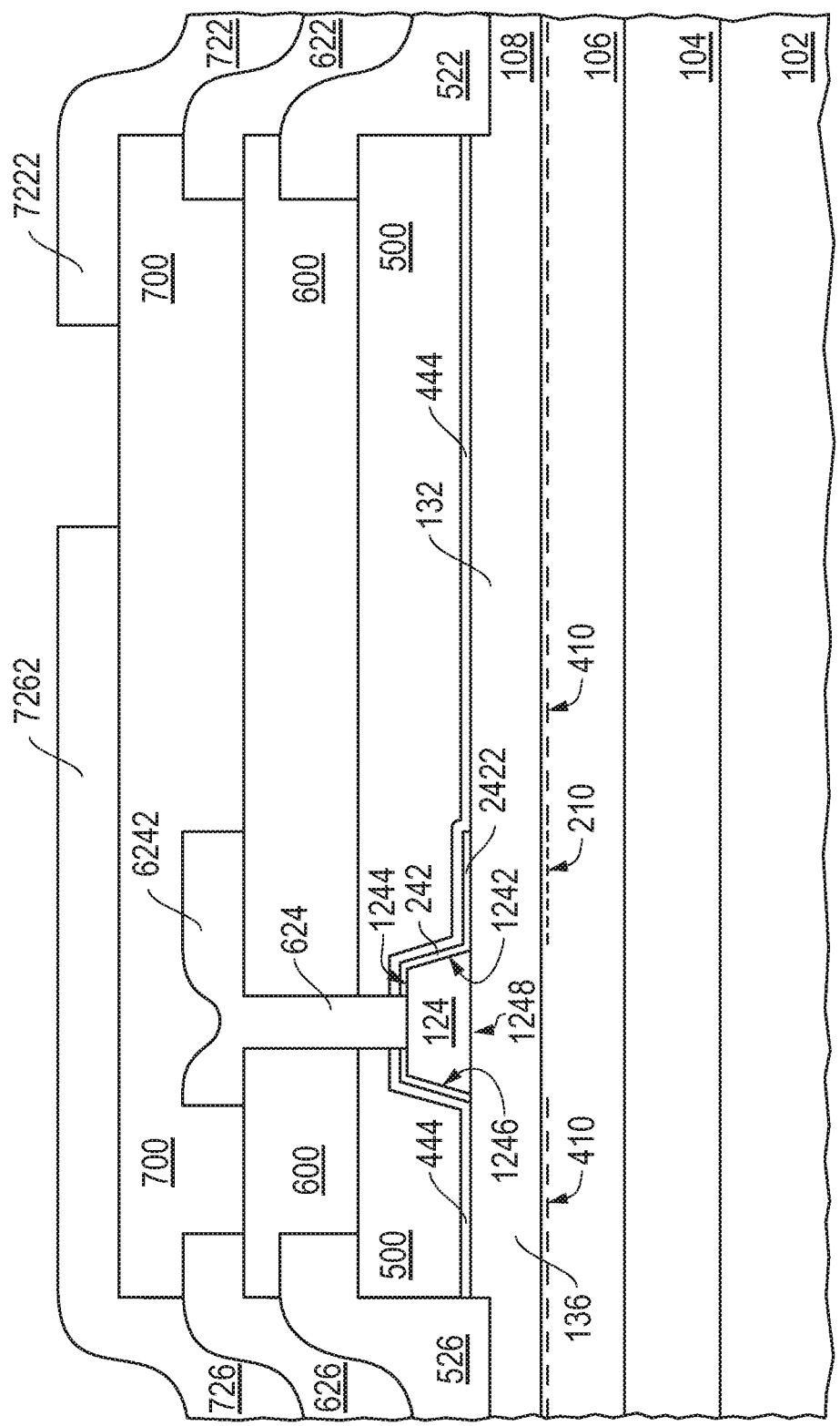
FIG. 7 includes an illustration including a cross-sectional view of the workpiece of FIG. 6 after forming another interlevel dielectric layer and patterned conductive layer.

FIG. 7 illustrates the workpiece after forming another ILD layer 700 and conductive members 722 and 726. The insulating layer 700 can have any of the compositions, number of films, and thicknesses as previously described with respect to the ILD layer 500. The ILD 700 can have the same composition or different compositions, the same or different number of films, and the same thickness or different thicknesses as compared to each of the ILD layers 500 and 600. The ILD layer 700 can be patterned to define openings for the conductive members 722 and 726. The contact openings for the conductive members 722 and the 726 extend through the ILD layer 700 to the conductive members 622 and 626 that are connected to the drain and source electrodes 522 and 526, respectively.

A conductive layer for the conductive members 722 and 726 is formed over the ILD layer 700 and within the contact openings. The conductive layer for the conductive members 722 and 726 can have any of the compositions, number of films, and thicknesses as previously described with respect to the conductive layer for the drain and source electrodes 522 and 526. The conductive layer for the conductive members 722 and 726 can have the same composition or different compositions, the same or different number of films, and the same thickness or different thicknesses as compared to the conductive layer for the drain and source electrodes 522 and 526 and the conductive members 622 and 626. The conductive layer is patterned to form the conductive members 722 and 726.

In this embodiment, the conductive member 722 includes a drain field electrode 7222 that extends laterally over the drain-side access region 132, and the conductive member 726 includes a source field electrode 7262 that extends laterally over the drain-side access region 132. The space between the drain and source field electrodes 7222 and 7262 is sufficient to such that there is an insignificant chance of breakdown or leakage current between drain and source terminals that are coupled to the conductive members 722 and 726. Similar to the gate field electrode 6242, the drain and source field electrodes 7222 and 7262 affect the electrical field along and under the drain-side access region 132. The source field electrode 7262 extends laterally farther over the drain-side access region 132 as compared to the gate field electrode 6242, and the drain electrode 522 is closer to the source field electrode 7262 than the gate field electrode 6242.

Figure 8:
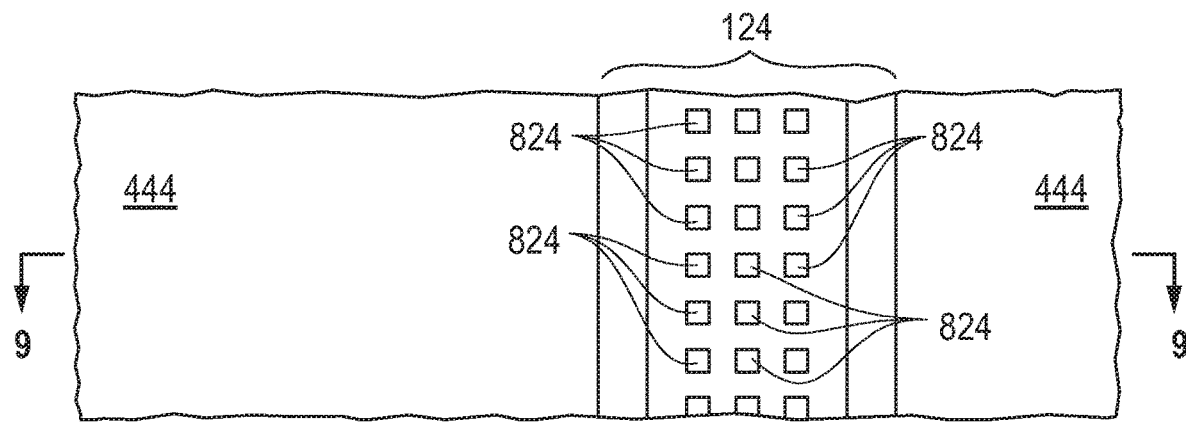
FIGS. 8 and 9 include illustrations including a top view and cross-sectional view of a portion of a workpiece including patterned openings to the gate electrode in accordance with another embodiment.
Figure 9:
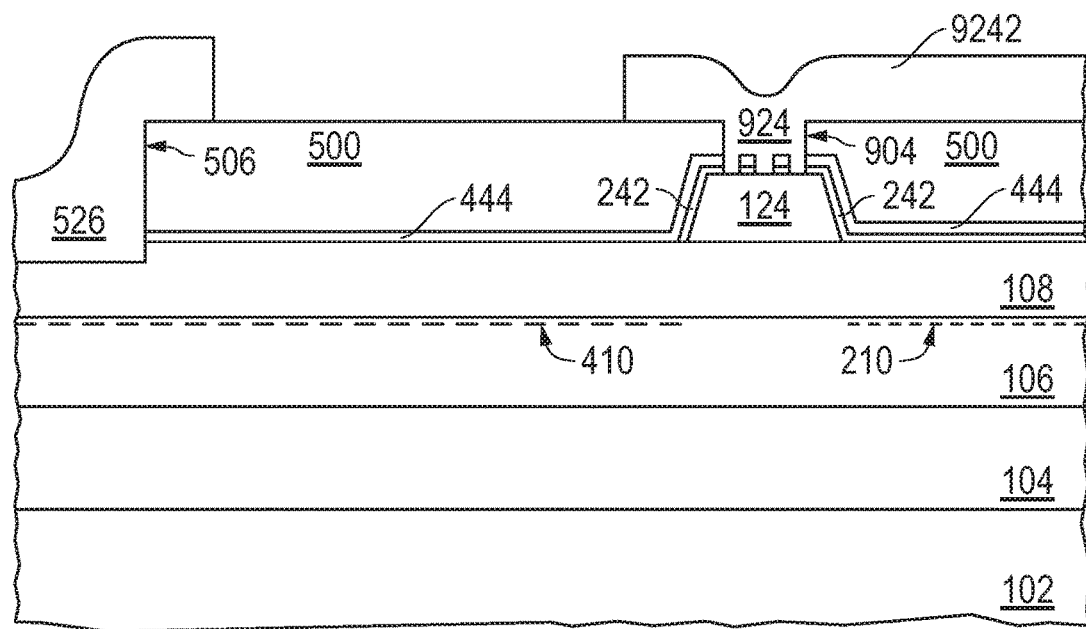

FIGS. 8 and 9 illustrate the workpiece that has patterned openings to the gate electrode 124 in accordance with another embodiment. After forming the upper dielectric film 444 as illustrated in FIG. 4, the lower and upper dielectric films 242 and 444 over the gate electrode 124 can be patterned to define openings 824 to the gate electrode 124. In the embodiment as illustrated, the remaining portions of the dielectric films 242 and 444 form a lattice that defines the openings 824. After forming the ILD layer 500, the ILD layer 500 is patterned to form the source contact opening 506 and a gate contact opening 904. A conductive layer is formed and patterned to form the source electrode 526 and a gate interconnect 924. In this embodiment, the gate interconnect 924 is formed from the same conductive layer as the source electrode 526. In another embodiment, the gate interconnect 924 can be formed at a different level as compared to the source electrode 526. The gate interconnect 924 includes a gate field electrode 9242 that can have any of the compositions and dimensions as previously described with respect to the gate interconnect 624 and gate field electrode 6242. The drain electrode 522 may also be formed; however, the scale in FIGS. 8 and 9 is different from FIGS. 5 to 7 to illustrate better the features in FIGS. 8 and 9.

The openings 824 reduce the amount of contact area between the gate electrode 124 and the gate interconnect 924, as compared to the contact opening for the gate interconnect 624. The reduced contact area increases the resistance between a gate terminal coupled to the gate interconnect 924 and the gate electrode 124. The increased resistance can help to reduce gate current ($I_G$) when the HEMT is turned on or when the HEMT is turned off with a negative gate voltage ($V_{GS}$<0).

Figure 10:
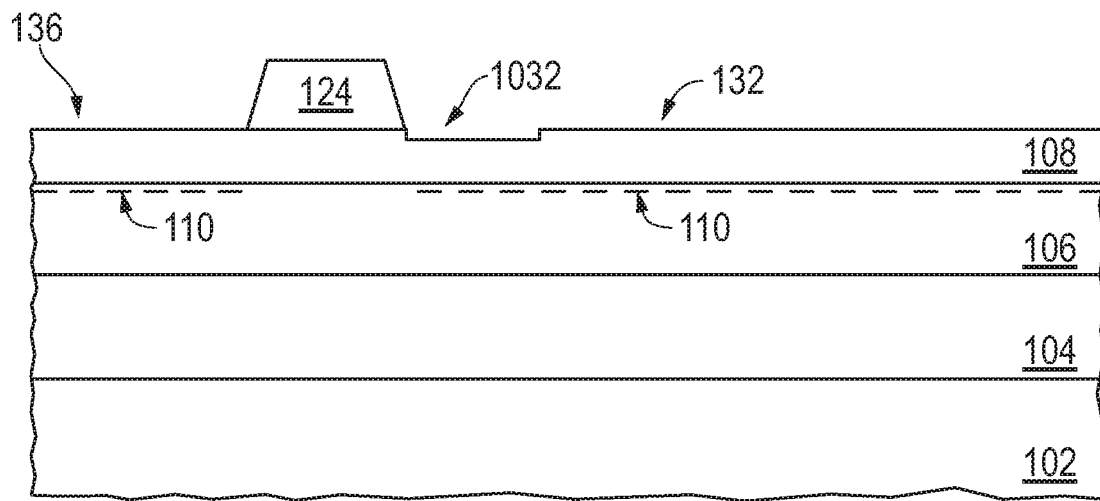
FIG. 10 includes an illustration including a cross-sectional view of a portion of a workpiece including a recessed barrier layer in accordance with another embodiment.
Figure 11:
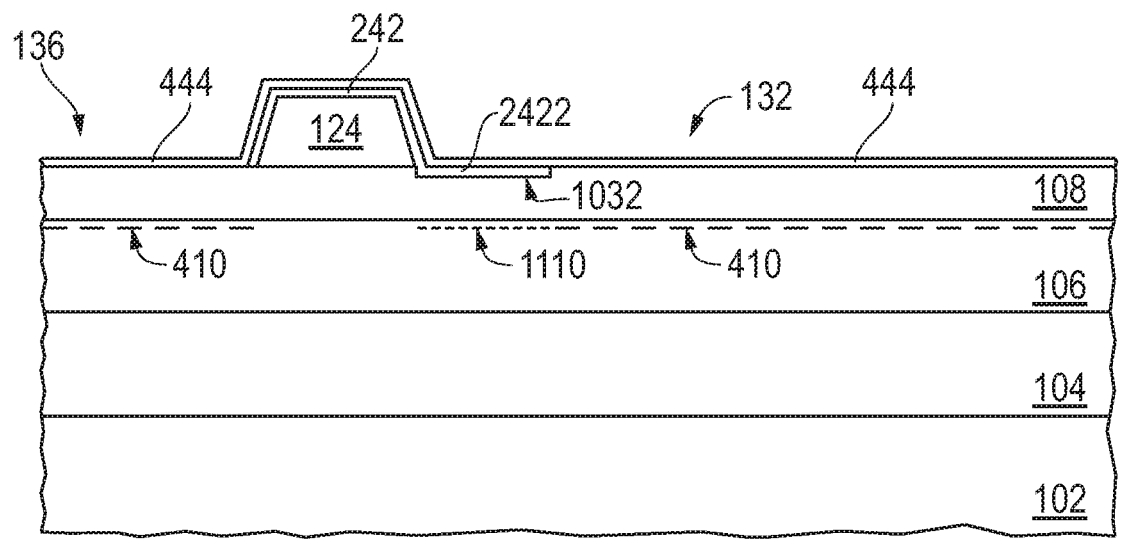
FIG. 11 includes an illustration including a cross-sectional view of a portion of a workpiece including a lower dielectric film formed within the recessed barrier layer in accordance with another embodiment.

In another embodiment, the barrier layer 108 can include a recession 1032 within the drain-side access region 132, as illustrated in FIG. 10. The recession 1032 can help to increase the threshold voltage of the HEMT being formed. The recession 1032 can have a depth that extends through at most 60%, at most 40% or at most 20% of the thickness of the barrier layer 108. The recession 1032 can extend laterally into the drain-side access region 132 for any distance as previously described with respect to the drain-side extension region 2422 of the lower dielectric film 242. In a particular embodiment, the lower dielectric film 242 may not be formed, and the remaining process as previously described starting with formation of the upper dielectric film 444 may be performed. In another particular embodiment, the lower dielectric film 242 with or without the drain-side extension region 2422 may be formed within the recession 1032 as illustrated in FIG. 11. The recession 1032 may extend laterally substantially the same distance into the drain-side access region 132 as compared to the drain-side extension region 2422. In another embodiment, the drain-side extension region 2422 can extend laterally a significantly different distance into the drain-side access region 132 as compared to the drain-side extension region 2422. When expressed as a fraction, the distance that the recession 1032 extends laterally into the drain-side access region 132 can be in a range of 0.5 times to 2.0 times the distance that the drain-side extension 2422 extends laterally over the drain-side access region 132. A 2DEG 1110 underlies the drain-side extension 2422 and has a higher sheet resistance than the 2DEG 410. The 2DEG 1110 can have a sheet resistance that is substantially the same or significantly higher than the 2DEG 210.

Figure 12:
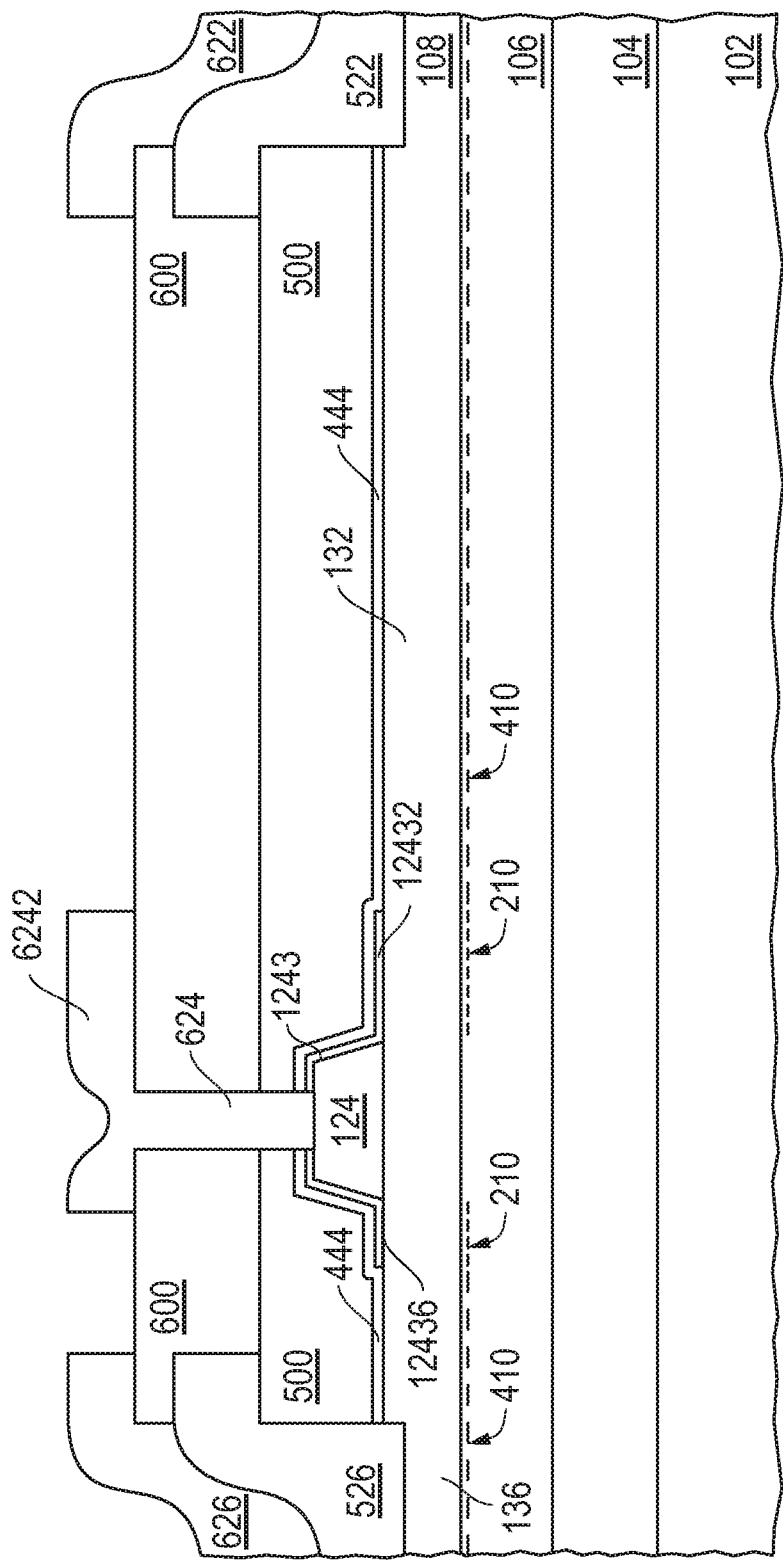
FIG. 12 includes an illustration including a cross-sectional view of a portion of a workpiece including a lower dielectric film including a portion extending from a gate electrode toward a source electrode in accordance with another embodiment.

FIG. 12 illustrates an embodiment where a lower dielectric film 1243 includes a drain-side extension region 12432 and a source-side extension region 12436. The drain-side extension region 12432 can be used for any of the reasons previously described with respect to the extension region 2422 of the lower dielectric film 242. The source-side extension region 12436 can help to increase the threshold voltage of the HEMT.

The lower dielectric film 1243 can have any of the compositions and thicknesses as previously described for the lower dielectric film 242. The drain-side extension region 12432 can extend any of the distances over the drain-side access region 132. The source-side extension region 12436 can extend laterally over the source-side access region 136 from the gate electrode 124 partly or completely to the source electrode 526. In an embodiment, the source-side extension region 12436 can extend laterally from the gate electrode 124 for a distance in a range of 0.1 micron to 0.2 micron. Such a distance can help increase the threshold voltage without increasing the sheet resistance of the 2DEG as would happen if the source-side extension region 12436 were to cover all of the source-side access region 136. The 2DEG 210 underlies the source-side extension region 12436, and the 2DEG 410 underlies portions of the source-side access region 136 not covered by the source-side extension region 12436.

Figure 13:
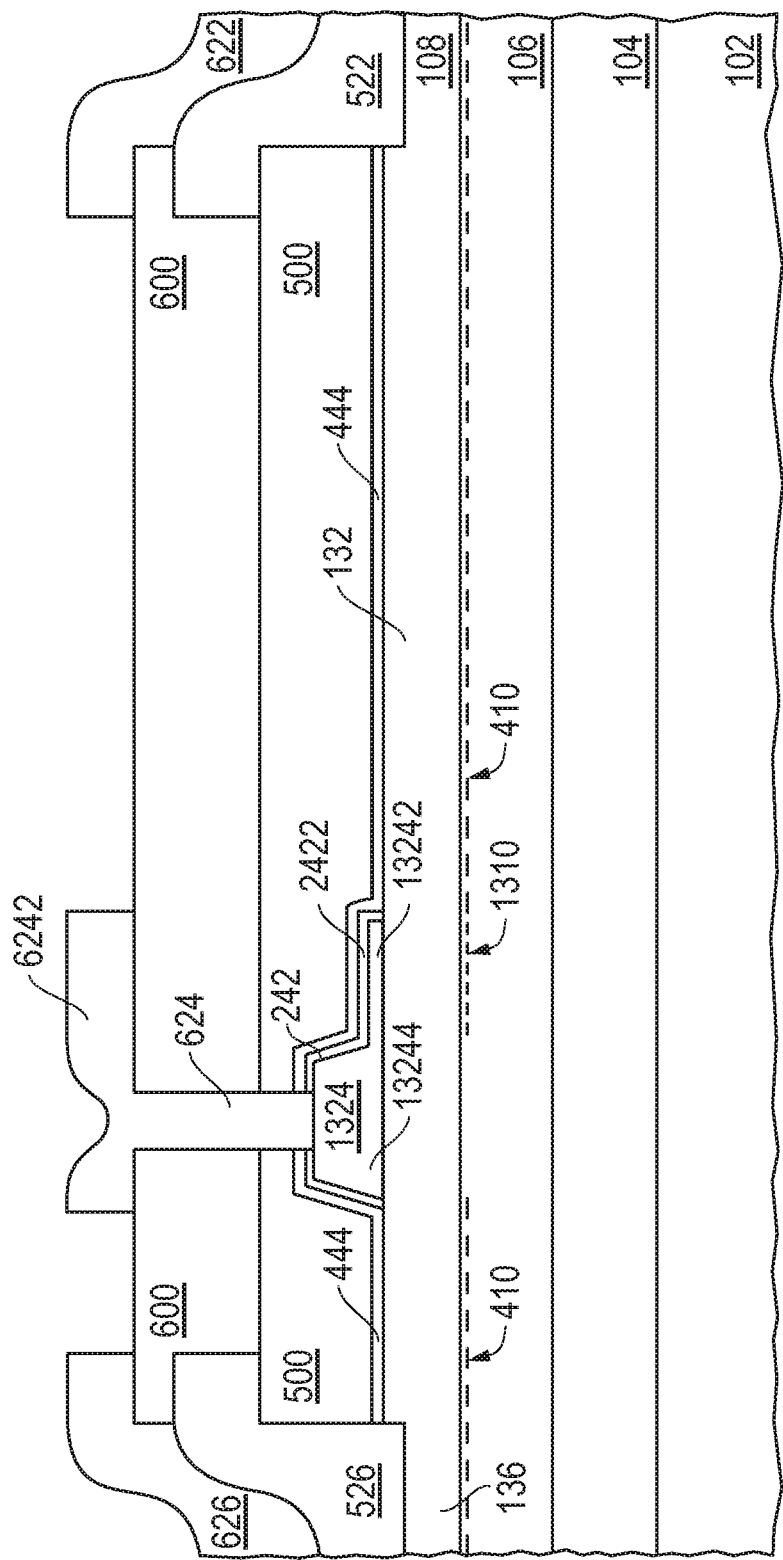
FIG. 13 includes an illustration including a cross-sectional view of a portion of a workpiece including a gate electrode including a body region and an extension region in accordance with another embodiment.

FIG. 13 illustrates another embodiment where a gate electrode 1324 includes a body region 13244 and an extension region 13242. The extension region 13242 can help to increase the sheet resistance of a 2DEG 1310 under the extension region 13242. The thickness of the extension region 13242 is sufficient to increase the sheet resistance of the 2DEG 1310 but not so thick as to effectively eliminate the 2DEG 1310. In an embodiment, the thickness of the extension region 13242 is at least 5 nm, at least 8 nm, or at least 11 nm, and in another embodiment, the thickness of the extension region 13242 is at most 40 nm, at most 36 nm, or at most 32 nm. The extension region 13242 can extend laterally toward the drain electrode 522 for any of the distances as previously described with respect to the extension region 2422 of the lower dielectric film 242. Thus, the drain electrode 522 is closer to the extension region 13242 than to the body region 13244. The lower dielectric film 242 is not required, and thus, the lower dielectric film 242 is optional. In another embodiment (not illustrated), another extension region of the gate electrode 1324 can extend laterally from the body region 13244 toward the source electrode 526.

Figure 14:
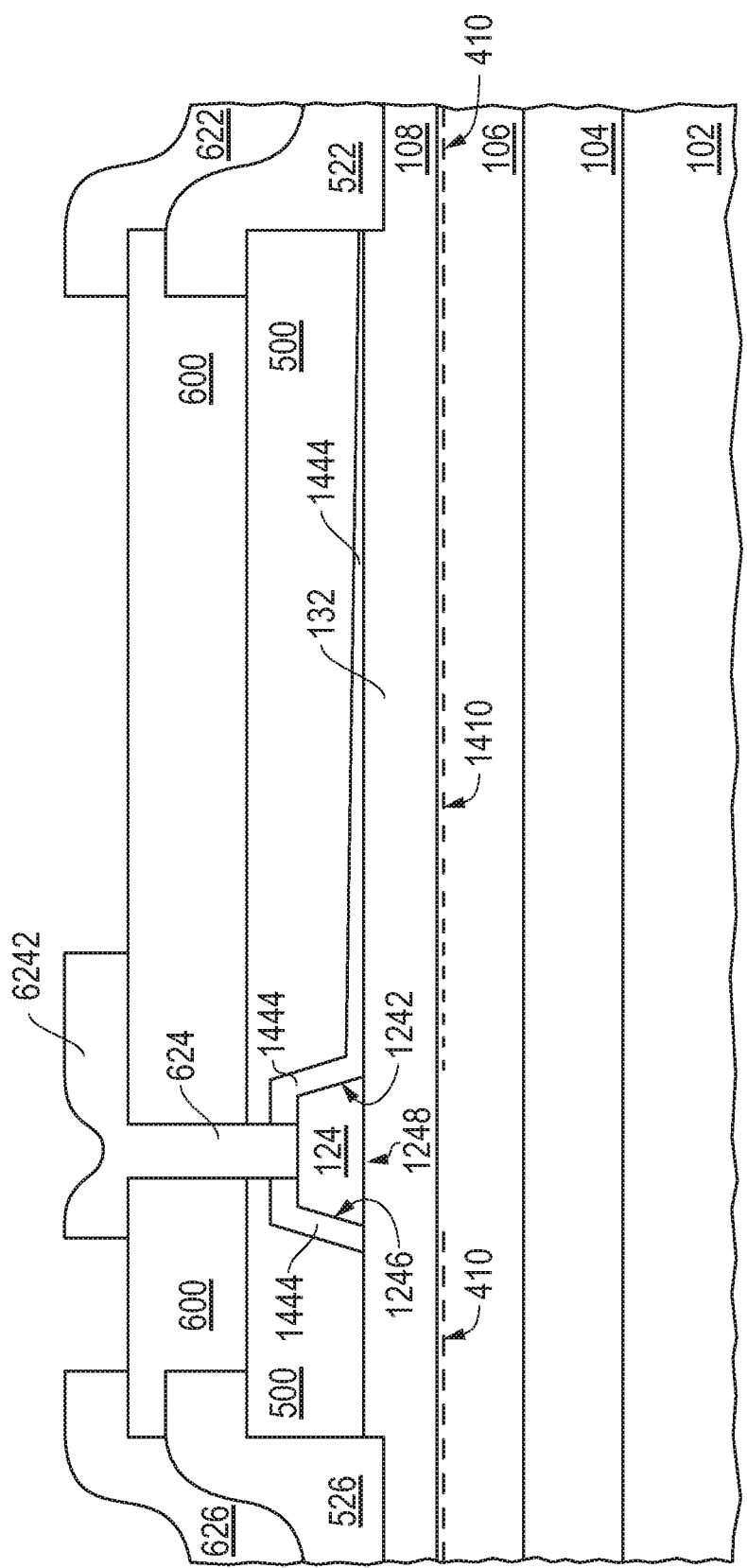
FIG. 14 includes an illustration including a cross-sectional view of a portion of a workpiece including a dielectric film having a varying thickness over a drain-side access region in accordance with another embodiment.

FIG. 14 includes another embodiment in which a dielectric film 1444 with a varying thickness can be used as an alternative to the upper and lower dielectric films 242 and 444. The dielectric film 1444 is not drawn to scale in order to improve understanding of the concept. In the embodiment as illustrated, the dielectric film 1444 can be a negatively charged film and include any of the materials as previously described with respect to the lower dielectric film 242. Over the drain-side access region 132, the dielectric film 1444 is thicker closer to the gate electrode 124 and thinner closer to the drain electrode 522. The change in thickness results in a changing electron density within the 2DEG 1410. For the 2DEG 1410, the electron density is lower and sheet resistance is higher near the gate electrode 124, and the electron density is higher and the sheet resistance is lower near the drain electrode 522.

In another embodiment (not illustrated), the dielectric film 1444 can be a positively charged film and include any of the materials as previously described with respect to the upper dielectric film 444. Over the drain-side access region 132, the dielectric film 1444 is thinner closer to the gate electrode 124 and thicker closer to the drain electrode 522. The change in thickness results in a changing electron density within the 2DEG 1410. For the 2DEG 1410, the electron density is lower and sheet resistance is higher near the gate electrode 124, and the electron density is higher and the sheet resistance is lower near the drain electrode 522.

When a negatively or positively charged dielectric film has a thickness of greater than 10 nm or greater, the change in electron density of the 2DEG 1410 becomes insignificant with a further increase in thickness of the dielectric films. When the dielectric film 1444 is a negatively charged film, its thickness can be at least 10 nm or more near the gate electrode 124 and have a thickness that may be 1 nm closer the drain electrode 522. The dielectric film 1444 may or may not extend completely to the drain electrode 522. When the dielectric film 1444 is a positively charged, its thickness can be at least 10 nm or more near the drain electrode 522 and have a thickness that may be 1 nm near the gate electrode 124. The dielectric film 1444 may or may not extend completely to the gate electrode 124. The thickness for the dielectric film 1444 can change as a continuous function of distance or may change in discrete steps.

In yet a further embodiment, the dielectric film 1444 and its changing thickness may be used with the upper dielectric film 444 when the dielectric film 1444 (as a lower dielectric film) is a negatively charged film or used with the lower dielectric film 242 when the dielectric film 1444 (as an upper dielectric film) is a positively charged film.

In another embodiment, the gate electrode 124 may be replaced by a gate dielectric layer and a metal gate electrode. The gate dielectric layer can include one or more films of an electrically insulating nitride or oxide. The gate dielectric layer can have a thickness in a range from 2 nm to 40 nm. The gate electrode can include one or more films of a metal, a metal alloy, a metal silicide, or the like. The film closest to the gate electric layer can have a work function that helps in providing a desired threshold voltage for the HEMT. The gate electrode can include Ti, TiN, Al, Pd, Pt, W, Au, Ni, or a stack or any combination thereof and has a thickness in a range of 50 nm to 500 nm. Other compositions and thicknesses for the gate dielectric layer and the gate electrode may be used without deviating from the concepts described herein. The process flow can continue formation of the lower dielectric film 242 in FIG. 2 and other subsequently formed features as previously described.

Embodiments as described herein can help with the performance of the transistor. The extension region of the lower dielectric film can locally increase the sheet resistance of the 2DEG near the gate electrode and allow for faster depletion of charge. The locally higher sheet resistance can be designed so $R_{DSON}$ for the transistor may not increase by more than 1 ohm·mm. The upper dielectric film can help reduce sheet resistance of the 2DEG to help counter some of the increased sheet resistance corresponding to the lower dielectric film. Cm can be lower and provide a lower Miller ratio. Output capacitance ($C_{OSS}$) for the HEMT is lower. Thus, the HEMT has improved switching characteristics. The lower dielectric film can help with more uniform subthreshold slope during turn on and increase the gate breakdown voltage.

Particular embodiments can offer other advantages or alternatives to the design of the HEMT. The contact area between the gate electrode and gate interconnect can be reduced to reduce the gate current when the HEMT is on. Such an embodiment can be useful when the gate electrode contacts the barrier or channel layer. A recession within the barrier layer near the gate electrode can be used to help increase the threshold voltage of the HEMT. The recession may or may not include the extension region of the lower dielectric film.

The lower dielectric film can include a source-side extension region over the source-side access region of the barrier layer. The source-side extension region can help to increase the threshold voltage of the HEMT. In a particular embodiment, the source-side extension may extend laterally only partly toward the source electrode, and thus, the 2DEG near the source electrode can have a lower sheet resistance as compared to a source-side extension that extends completely to the source electrode.

In still another embodiment, the gate electrode can include a body region and an extension region. The extension region for the lower dielectric film may or may not be used. The lower dielectric film may still be used along the sidewalls and top surface of the gate electrode to protect the upper drain-side and source-side corner of the gate electrode that can help improve the subthreshold characteristics of the HEMT.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1

An electronic device including a high electron mobility transistor including a gate electrode; a drain electrode; an access region including a first portion closer to the gate electrode and a second portion closer to the drain electrode; a first dielectric film including a first material and overlying the first portion and not the second portion of the access region; and a second dielectric film including a second material and overlying the second portion of the access region, wherein the second material is different from the first material.

Embodiment 2

The electronic device of Embodiment 1, wherein the first dielectric film includes $Si_3N_4$, $SiO_kN_1$, where k<1, AlN, $AlO_rN_s$, where r<s, or another nitrogen-containing dielectric material that provides a negatively charged dielectric film, and the second dielectric film includes $Al_2O_3$, $AlO_tN_u$, where t>u, $SiO_2$, $HfO_2$, $SiO_mN_n$, where m>n, or another oxygen-containing dielectric material that provides a positively charged dielectric film.

Embodiment 3

The electronic device of Embodiment 1, wherein the gate electrode has a top surface and a first sidewall that meet at a first corner, and the first dielectric film contacts the top surface and sidewall of the gate electrode at the first corner.

Embodiment 4

The electronic device of Embodiment 3, further including a gate interconnect, wherein gate electrode has a second sidewall opposite the first sidewall, the second sidewall meets the top surface at a second corner, and the gate interconnect contacts a portion of the top surface of the gate electrode and is spaced apart from the first and second corners.

Embodiment 5

The electronic device of Embodiment 4, wherein the first dielectric film defines openings to the gate electrode, a portion of the first dielectric film is disposed between the openings, and a gate interconnect extending into the openings of the dielectric film and contacting the gate electrode.

Embodiment 6

The electronic device of Embodiment 4, wherein a gate field electrode is part of or electrically connected to the gate interconnect, wherein the first dielectric film is disposed between the gate field electrode and the first portion of the access region.

Embodiment 7

The electronic device of Embodiment 6, wherein the first dielectric film extends a first distance over the access region, the gate field electrode extends a second distance over the access region, and the second distance is in a range from 0.5 times to 2.0 times the first distance.

Embodiment 8

The electronic device of Embodiment 7, further including a source electrode and a source field electrode that is part of or electrically connected to the source electrode, wherein:
  the drain electrode is closer to the first corner of the gate electrode than to the second corner of the gate electrode,
  the first dielectric film includes silicon nitride, and the second dielectric film includes aluminum oxide,
  the first dielectric film contacts the top surface and the second sidewall of the gate electrode at the second corner,
  the second dielectric film overlies the first portion of the access region, and
  the drain electrode is closer to the source field electrode than to the gate field electrode.

Embodiment 9

The electronic device of Embodiment 8, wherein the second dielectric film includes a first portion extending from the gate interconnect to the drain electrode and a second portion extending from the gate interconnect to the source electrode.

Embodiment 10

The electronic device of Embodiment 4, further including a source electrode and a source field electrode that is part of or electrically connected to the source electrode, wherein at least a portion of the source field electrode overlies the gate field electrode.

Embodiment 11

The electronic device of Embodiment 1, further including a barrier layer underlying the gate electrode, wherein the barrier layer is relatively thinner closer to the gate electrode and relatively thicker closer to the drain electrode.

Embodiment 12

The electronic device of Embodiment 1, wherein the gate electrode has a body region and an extension region extending from the body region, wherein the body and extension regions have a same composition and lie along a bottom surface of the gate electrode, and the drain electrode is closer to the extension region than to the body region.

Embodiment 13

The electronic device of Embodiment 1, further including a source electrode, wherein the first dielectric film extends at least a portion of a distance from the gate electrode toward the source electrode.

Embodiment 14

The electronic device of Embodiment 1, further including a channel layer including $Al_xGa_{(1-x)}N$, wherein $0 \le x \le 0.1$; and a barrier layer including $Al_yIn_zGa_{(1-y-z)}N$, wherein $0 \le y \le 1.0$, $0 \le z \le 0.3$, $0 < (y+z) \le 1$, the barrier layer has a lower Ga content as compared to the channel layer, and the barrier layer is disposed between the channel layer and the gate electrode.

Embodiment 15

The electronic device of Embodiment 1, wherein the gate electrode includes a III-N semiconductor material.

Embodiment 16

The electronic device of Embodiment 1, further including a gate dielectric layer underlying the gate electrode, wherein the gate electrode includes a metal or metal alloy in contact with the gate dielectric layer.

Embodiment 17

An electronic device including a high electron mobility transistor including a gate electrode having a top surface and a sidewall; a drain electrode; an access region including a first portion closer to the gate electrode and a second portion closer to the drain electrode; and a dielectric film contacting the top surface and sidewall of the gate electrode and overlying the access region. The dielectric film can be a negatively charged film and relatively thicker over the first portion of the access region and relatively thinner over the second portion of the access region, or the dielectric film can be a positively charged film and relatively thinner over the first portion of the access region and relatively thicker over the second portion of the access region.

Embodiment 18

The electronic device of Embodiment 17, further including a gate field electrode that is part of or electrically connected to the gate electrode, wherein the gate field electrode extends over the relatively thinner portion of the dielectric film and not over the relatively thicker portion of the dielectric film.

Embodiment 19

An electronic device including a high electron mobility transistor including a gate electrode; a dielectric film overlying the gate electrode and defining openings to the gate electrode, wherein a portion of the dielectric film is disposed between the openings; and a gate interconnect extending into the openings of the dielectric film and contacting the gate electrode and the portion of the dielectric film.

Embodiment 20

The electronic device of Embodiment 19, further including a channel layer and a barrier layer overlying the channel layer, wherein the gate electrode includes a III-N semiconductor material and contacts the channel or barrier layer.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising a high electron mobility transistor comprising:
    a gate electrode having a top surface;
    a drain electrode;
    an access region including a first portion closer to the gate electrode and a second portion closer to the drain electrode;
    a first dielectric film including a first material and overlying the first portion and not the second portion of the access region, wherein the first dielectric film includes a portion that overlies the top surface of the gate electrode, and the first dielectric film is spaced apart from the drain electrode; and
    a second dielectric film including a second material and overlying the second portion of the access region, wherein the second material is different from the first material.

2. The electronic device of claim 1, wherein:
    the first dielectric film includes $Si_3N_4$, $SiO_kN_l$, where k<l, AlN, $AlO_rN_s$, where r<s, or another nitrogen-containing dielectric material that provides a negatively charged dielectric film, and
    the second dielectric film includes $Al_2O_3$, $AlO_tN_u$, where t>u, $SiO_2$, $HfO_2$, $SiO_mN_n$, where m>n, or another oxygen-containing dielectric material that provides a positively charged dielectric film.

3. The electronic device of claim 1, wherein the gate electrode has a first sidewall that meets the top surface of the gate electrode at a first corner, and the first dielectric film contacts the top surface and sidewall of the gate electrode at the first corner.

4. The electronic device of claim 3, further comprising a gate interconnect, wherein gate electrode has a second sidewall opposite the first sidewall, the second sidewall meets the top surface at a second corner, and the gate interconnect contacts a portion of the top surface of the gate electrode and is spaced apart from the first and second corners.

5. The electronic device of claim 4, wherein:
    the first dielectric film defines openings to the gate electrode, a portion of the first dielectric film is disposed between the openings, and
    a gate interconnect extending into the openings of the dielectric film and contacting the gate electrode.

6. The electronic device of claim 4, wherein a gate field electrode is part of or electrically connected to the gate interconnect, wherein the first dielectric film is disposed between the gate field electrode and the first portion of the access region.

7. The electronic device of claim 6, wherein the first dielectric film extends a first distance over the access region, the gate field electrode extends a second distance over the access region, and the second distance is in a range from 0.5 times to 2.0 times the first distance.

8. The electronic device of claim 7, further comprising a source electrode and a source field electrode that is part of or electrically connected to the source electrode, wherein:
    the drain electrode is closer to the first corner of the gate electrode than to the second corner of the gate electrode,
    the first dielectric film includes silicon nitride, and the second dielectric film includes aluminum oxide,
    the first dielectric film contacts the top surface and the second sidewall of the gate electrode at the second corner,
    the second dielectric film overlies the first portion of the access region, and
    the drain electrode is closer to the source field electrode than to the gate field electrode.

9. The electronic device of claim 8, wherein the second dielectric film includes a first portion extending from the gate interconnect to the drain electrode and a second portion extending from the gate interconnect to the source electrode.

10. The electronic device of claim 4, further comprising a source electrode and a source field electrode that is part of or electrically connected to the source electrode, wherein at least a portion of the source field electrode overlies the gate field electrode.

11. The electronic device of claim 1, further comprising a barrier layer underlying the gate electrode, wherein the barrier layer is relatively thinner closer to the gate electrode and relatively thicker closer to the drain electrode.

12. The electronic device of claim 1, wherein the gate electrode has a body region and an extension region extending from the body region, wherein the body and extension regions have a same composition and lie along a bottom surface of the gate electrode, and the drain electrode is closer to the extension region than to the body region.

13. The electronic device of claim 1, further comprising a source electrode, wherein the first dielectric film extends at least a portion of a distance from the gate electrode toward the source electrode.

14. The electronic device of claim 1, further comprising:
a channel layer including $Al_xGa_{(1-x)}N$, wherein $0 \leq x \leq 0.1$; and
a barrier layer including $Al_yIn_zGa_{(1-y-z)}N$, wherein $0 \leq y \leq 1.0$, $0 \leq z \leq 0.3$, $0 < (y+z) \leq 1$,
the barrier layer has a lower Ga content as compared to the channel layer, and the
barrier layer is disposed between the channel layer and the gate electrode.

15. The electronic device of claim 1, wherein the gate electrode includes a III-N semiconductor material.

16. The electronic device of claim 1, further comprising a gate dielectric layer underlying the gate electrode, wherein the gate electrode includes a metal or metal alloy in contact with the gate dielectric layer.

17. An electronic device comprising a high electron mobility transistor comprising:
a gate electrode having a top surface and a sidewall;
a drain electrode;
an access region including a first portion closer to the gate electrode and a second portion closer to the drain electrode, wherein each of the first portion and the second portion is between the gate electrode and the drain electrode; and
a dielectric film contacting the top surface and sidewall of the gate electrode and overlying the access region, wherein:
the dielectric film is a negatively charged film and relatively thicker over the first portion of the access region and relatively thinner over the second portion of the access region.

18. The electronic device of claim 17, further including a gate field electrode that is part of or electrically connected to the gate electrode, wherein the gate field electrode extends over the relatively thinner portion of the dielectric film and not over the relatively thicker portion of the dielectric film.

19. The electronic device of claim 1, further comprising a gate interconnect, wherein:
the first dielectric film defines openings to the gate electrode, wherein a portion of the first dielectric film is disposed between the openings; and
the gate interconnect extends into the openings of the first dielectric film and contacts the gate electrode and the portion of the first dielectric film.

20. An electronic device comprising a high electron mobility transistor comprising:
a gate electrode;
a drain electrode;
an access region including a first portion closer to the gate electrode and a second portion closer to the drain electrode;
a first dielectric film including a first material and overlying the first portion and not the second portion of the access region;
a second dielectric film including a second material and overlying the second portion of the access region, wherein the second material is different from the first material;
an interlevel dielectric layer overlying the first dielectric film and the second dielectric film; and
a gate interconnect extending through an opening in the interlevel dielectric layer and contacting the gate electrode.

* * * * *